United States Patent
Noma

(10) Patent No.: US 9,893,742 B1
(45) Date of Patent: Feb. 13, 2018

(54) INFORMATION PROCESSING DEVICE, INFORMATION PROCESSING METHOD, AND INFORMATION PROCESSING PROGRAM FOR DATA COMPRESSION

(71) Applicant: FUJITSU LIMITED, Kawasaki-shi, Kanagawa (JP)

(72) Inventor: Yui Noma, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/701,650

(22) Filed: Sep. 12, 2017

(30) Foreign Application Priority Data

Oct. 4, 2016 (JP) .................................. 2016-196188

(51) Int. Cl.
*H03M 7/38* (2006.01)
*H03M 7/40* (2006.01)
*H03M 7/30* (2006.01)

(52) U.S. Cl.
CPC ........... *H03M 7/40* (2013.01); *H03M 7/3084* (2013.01)

(58) Field of Classification Search
CPC ......... H03M 7/40; H03M 7/3084; H03M 7/30
USPC .............................................. 341/50, 51, 87
See application file for complete search history.

(56) References Cited

U.S. PATENT DOCUMENTS

| | | | | |
|---|---|---|---|---|
| 6,438,569 | B1 * | 8/2002 | Abbott | G06F 7/5443 708/603 |
| 6,996,552 | B2 * | 2/2006 | Johnson | G06F 7/48 706/52 |
| 9,235,392 | B2 * | 1/2016 | Dally | G06F 8/4432 |
| 9,477,477 | B2 * | 10/2016 | Dally | G06F 8/437 |
| 2011/0299782 | A1 | 12/2011 | Hamsici et al. | |
| 2014/0132429 | A1 * | 5/2014 | Scoville | H03M 7/30 341/87 |
| 2015/0248458 | A1 * | 9/2015 | Sakamoto | G06F 17/30097 707/719 |

FOREIGN PATENT DOCUMENTS

| | | |
|---|---|---|
| JP | 2013-513168 | 4/2013 |
| JP | 2015-050659 | 3/2015 |

OTHER PUBLICATIONS

P. T. Boufounos et al., "1-Bit Compressive Sensing", IEEE, Information Sciences and Systems 2008, CISS 2008, 42nd Annual Conference on Mar. 19-21, 2008, pp. 16-21.

Petros T. Boufounos, "Greedy Sparse Signal Reconstruction from Sign Measurements", IEEE, Signals, Systems and Computers, 2009 Conference Record of the Forty-Third Asilomar Conference on Nov. 1-4, 2009, pp. 1305-1309.

\* cited by examiner

*Primary Examiner* — Jean B Jeanglaude
(74) *Attorney, Agent, or Firm* — Staas & Halsey LLP

(57) ABSTRACT

An information processing method for a computer for data compression, the method includes: performing projective transformation of a first numeric string corresponding to an input signal into a second numeric string which contains more components than the first numeric string and having a sum of squares of components as a predetermined value by using a plurality of projective parameters; and generating a bit string in which bits indicating positive and negative signs of the respective components of an operation result obtained by a vector product operation of the second numeric string obtained by the projective transformation and an observation matrix are arranged.

11 Claims, 8 Drawing Sheets

INFORMATION PROCESSING DEVICE, INFORMATION PROCESSING METHOD, AND INFORMATION PROCESSING PROGRAM FOR DATA COMPRESSION

CROSS-REFERENCE TO RELATED APPLICATION

This application is based upon and claims the benefit of priority of the prior Japanese Patent Application No. 2016-196188, filed on Oct. 4, 2016, the entire contents of which are incorporated herein by reference.

FIELD

The embodiment discussed herein is related to an information processing device for data compression, an information processing method, and an information processing program.

BACKGROUND

In the related art, there is a 1-bit compressive sensing technique for compressing a numeric string having n components to a bit string having m components, in which bits indicating positive and negative signs of the respective components of an operation result obtained by a vector product operation of a numeric string having n components and an observation matrix of m rows by n columns are arranged (Non-Patent Literature "P. T. Boufounos and R. G. Baraniuk, "1-bit compressive sensing," in *Annu. Conf Information Sciences and Systems* (*CISS*), 42nd, 2008").

As the related art, for example, there is a technique in which a random measurement matrix is generated using a measurement matrix generation parameter, a signal is compressed using the random measurement matrix, and 2-bit quantization of the compressed signal is performed using a quantization threshold value. (Japanese Laid-open Patent Publication No. 2015-50659) In addition, for example, there is a technique for generating descriptors relating to feature points in a scale space based on a combination of sparse projective vectors and pixel information sparsely sampled for a plurality of pixels over a plurality of scale levels. (Japanese Laid-open Patent Publication No. 2013-513168)

However, in the above-described techniques of the related art, it is difficult to specify sizes of respective components of a numeric string before compression even if decompression processing is performed on a compressed bit string, and it is difficult to decompress back to the numeric string before compression in some cases. For example, when compressing a numeric string to a bit string, information on the sizes of respective components of the numeric string disappears and even if decompression processing is performed on the compressed bit string, it may not be possible to specify the sizes of respective components of the numeric string before compression.

In one aspect, the embodiment aims to provide an information processing device, an information processing method, and an information processing program capable of specifying sizes of respective components of a numeric string before compression at the time of decompression processing.

SUMMARY

According to an aspect of the invention, an information processing method for data compression includes: performing projective transformation of a first numeric string corresponding to an input signal into a second numeric string which contains more components than the first numeric string and having a sum of squares of components as a predetermined value by using a plurality of projective parameters; and generating a bit string in which bits indicating positive and negative signs of the respective components of an operation result obtained by a vector product operation of the second numeric string obtained by the projective transformation and an observation matrix are arranged.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Hereinafter, an embodiment of an information processing device, an information processing method, and an information processing program according to the present disclosure will be described in detail with reference to the drawings.

(One Example of Information Processing Method According to Embodiment)

Figure 1:
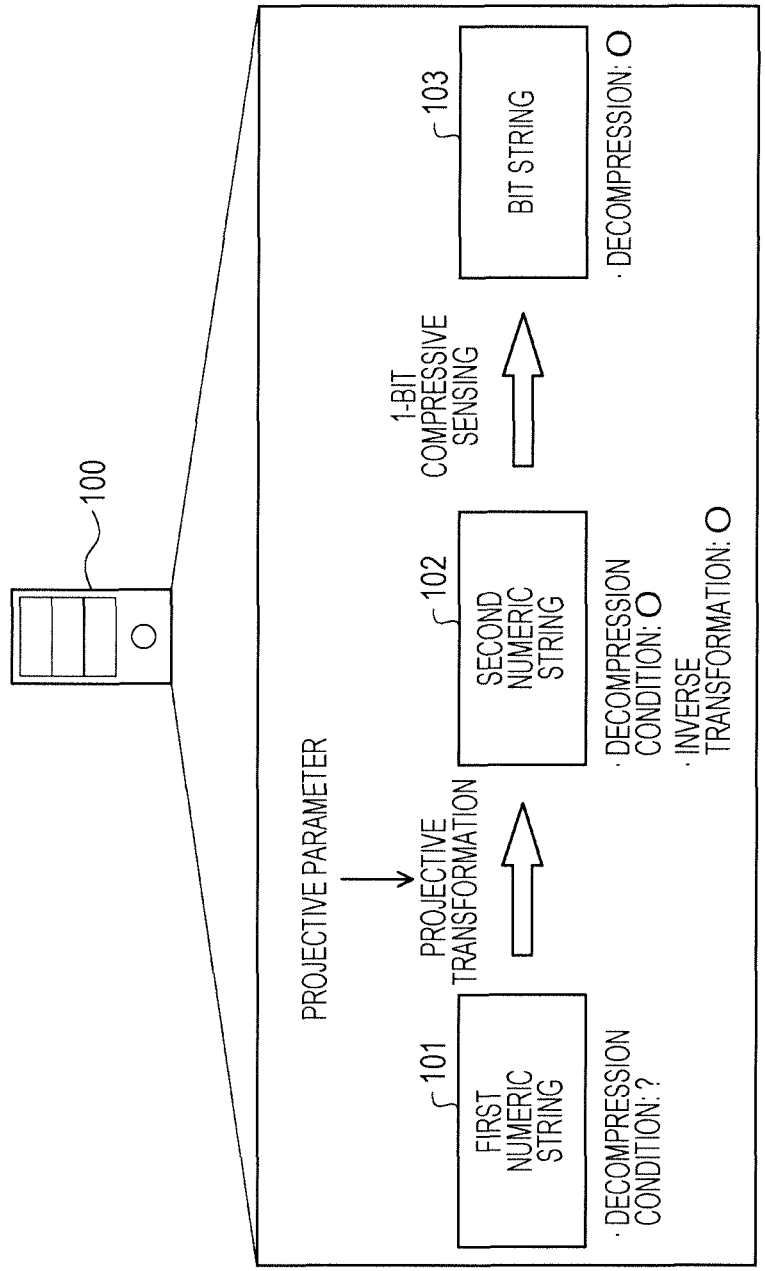
FIG. 1 is an explanatory diagram illustrating an example of an information processing method according to an embodiment.

FIG. 1 is an explanatory diagram illustrating one example of an information processing method according to the embodiment. An information processing device 100 is a computer capable of compressing a numeric string into a bit string using 1-bit compressive sensing. The numeric string is data in which plural numerical values are arranged. The bit string is data in which a plurality of bits are arranged.

In the related art, there is a demand for storing numeric strings corresponding to image data, sound data, sensor data, and the like measured by a camera, a microphone, a sensor or the like in a storage medium in a state that the numeric strings may be utilized. Here, if there are many numeric strings, it is preferable to compress and store the numeric strings in a storage medium. When compressing a numeric string, for example, it is conceivable to transform a numeric string into a more sparse numeric string and then compress the numeric string. When compressing a numeric string, for example, 1-bit compressive sensing that compresses a numeric string to a bit string is used.

However, in 1-bit compressive sensing, even if decompression processing is performed on a compressed bit string, since it is difficult to specify the sizes of respective components of the numeric string before compression, it may be difficult to restore the numeric string before compression. For example, when compressing a numeric string into a bit string, information on the sizes of respective components of the numeric string disappears, therefore, it is difficult to uniquely specify the sizes of respective components of the numeric string before compression at the time of decompression processing. Specifically, either in the case of compressing a certain numeric string or in the case of compressing another numeric string doubling the respective components of the certain numeric string, a same bit string is generated as a compression result. For this reason, it is difficult to uniquely specify the sizes of respective components of the numeric string before compression based on a generated bit string.

On the other hand, it is conceivable to specify the sizes of respective components of a numeric string before compression at the time of decompression processing by making the numeric string satisfying a predetermined decompression condition as a compression target. The predetermined decompression condition is a condition capable of specifying the sizes of respective components of the numeric string before compression at the time of decompression processing. The predetermined decompression condition is, for example, a condition that a relatively large number of zero components are included and a sum of squares of the components is 1. However, when compressing a numeric string that does not satisfy the predetermined decompression condition into a bit string, information on the sizes of respective components of the numeric string disappears, therefore, it is difficult to uniquely specify the sizes of respective components of the numeric string before compression at the time of decompression processing. As a result, situations where 1-bit compressive sensing is easy to use may be limited.

Therefore, in the present embodiment, an information processing method in which 1-bit compressive sensing may be performed after performing projective transformation of a numeric string to be compressed into a numeric string having more components than the numeric string to be compressed and satisfying the predetermined decompression condition will be described. According to the information processing method, it is possible to uniquely specify the sizes of respective components of the numeric string before compression at the time of decompression processing by leaving information indicating the sizes of respective components of the numeric string before compression in a compressed bit string, and it is possible to decompress back to the numeric string before compression.

In the example of FIG. 1, the information processing device 100 acquires a first numeric string 101 corresponding to an input signal as a numeric string to be compressed. The input signal is image data, sound data, sensor data, and the like measured by a camera, a microphone, a sensor, or the like. The numeric string to be compressed is a numeric string including zero components. The numeric string to be compressed is preferably a sparse numeric string.

The first numeric string 101 is a numeric string indicating image data, sound data, sensor data, or the like. Each component of the numeric string is, for example, a single precision floating point number or fixed point number, or double precision floating point number or fixed point number. The first numeric string 101 may be a sparse numeric string obtained by performing a predetermined operation on a numeric string indicating image data, sound data, sensor data, or the like. The predetermined operation is, for example, a discrete cosine transform, the Fourier transform, wavelet basis expansion, or the like.

(1-1) The information processing device 100 performs projective transformation of the first numeric string 101 into a second numeric string 102 containing more components than the first numeric string 101 and having a sum of squares of components as a predetermined value by using a plurality of projective parameters. The information processing device 100 performs projective transformation of the first numeric string 101 having n components into the second numeric string 102 having 2n components, for example. According to this, even if the first numeric string 101 does not satisfy the decompression condition of 1-bit compressive sensing, the information processing device 100 may generate the second numeric string 102 that may be performed inverse projective transformation into the first numeric string 101 and satisfy the decompression condition of 1-bit compressive sensing.

(1-2) The information processing device 100 generates a bit string 103 in which bits indicating positive and negative signs of the respective components of the operation result obtained by a vector product operation of the second numeric string 102 obtained by projective transformation and the observation matrix are arranged. For example, the information processing device 100 generates the bit string 103 having m components in which bits indicating positive and negative signs of respective components of the operation result of a vector product operation of the second numeric string 102 having 2n components and the observation matrix of m rows by 2n columns are arranged, using 1-bit compressive sensing. According to this, the information processing device 100 may specify the sizes of respective components of the second numeric string 102 even if the second numeric string 102 is compressed to the bit string 103.

As described above, the information processing device 100 may specify the sizes of respective components of the second numeric string 102 based on the bit string 103 and generate the first numeric string 101 based on the second numeric string 102. In this way, the information processing device 100 may specify the sizes of respective components of the first numeric string 101 based on the generated bit string 103. In other words, the information processing device 100 may generate the bit string 103 that potentially includes information indicating the sizes of respective components of the first numeric string 101 even if the first numeric string 101 is a numeric string that does not satisfy the decompression condition of 1-bit compressive sensing. As a result, the information processing device 100 may handle a relatively large numeric string as a numeric string that may be decompressed in 1-bit compressive sensing.

In addition, in the case of sending the generated bit string 103 to another computer, the information processing device 100 may reduce the amount of communication with the other computer as compared with the case where the numeric string before compression is directly transmitted to another computer. The other computer may decompress back to the numeric string before compression from the received bit string 103 by using the observation matrix and the projective parameter.

In addition, in the case of accumulating the bit string 103 generated from each numeric string of a plurality of numeric strings to be compressed, the information processing device 100 may reduce the usage amount of a storage area as compared with the case where the plurality of numeric strings to be compressed are stored as they are. In addition, the information processing device 100 may use the accumulated bit string 103 as an input for machine learning.

In addition, since the information processing device 100 may decompress back to the numeric string before compression, it is possible to decompress back to the plurality of numeric strings before compression and calculate a similarity between the numeric strings. Then, based on the calculated similarity, the information processing device 100 may detect a similar numeric string before compression.

Based on the Hamming distance between the accumulated bit strings 103, the information processing device 100 may calculate the similarity between the bit strings 103 that may approximate the similarity between numeric strings before compression. For example, the Hamming distance indicates that the larger the value is, the less the similarity is. Then, since the information processing device 100 may simplify the operation, it is easy to shorten the time taken to detect similar numeric strings before compression, or it is possible to save power.

In the following description, the numeric string having n components to be compressed may be expressed as a "sparse vector". In addition, in the following description, a numeric string having 2n components obtained by projective transformation of a numeric string having n components to be compressed may be expressed as a "projective vector".

(Hardware Configuration Example of Information Processing Device 100)

Next, a hardware configuration example of the information processing device 100 illustrated in FIG. 1 will be described with reference to FIG. 2.

Figure 2:
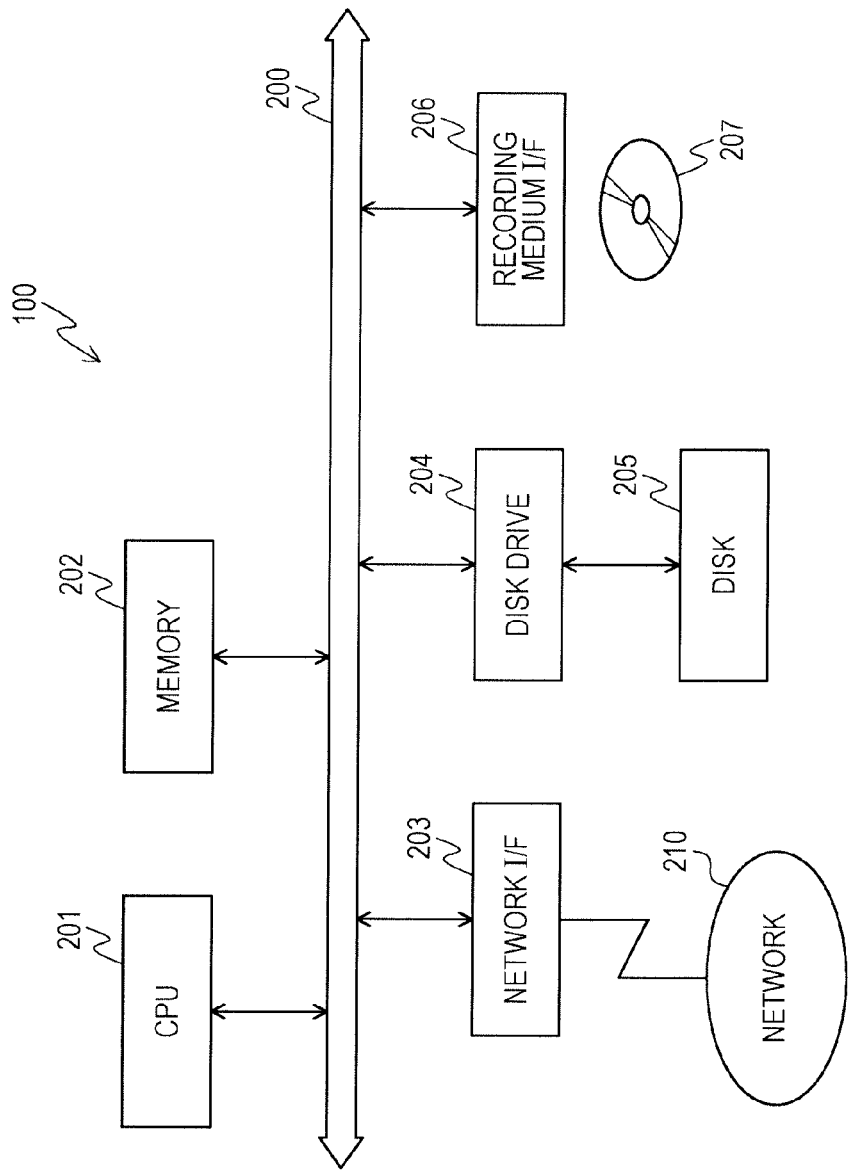
FIG. 2 is a block diagram illustrating a hardware configuration example of an information processing device.

FIG. 2 is a block diagram illustrating a hardware configuration example of the information processing device 100. In FIG. 2, the information processing device 100 includes a central processing unit (CPU) 201, a memory 202, a network I/F (Interface) 203, a disk drive 204, a disk 205, and a recording medium I/F 206. In addition, respective components are connected via a bus 200.

Here, the CPU 201 controls the overall information processing device 100. The memory 202 includes, for example, a read-only memory (ROM), a random-access memory (RAM), a flash ROM, and the like. Specifically, for example, a flash ROM or ROM stores various programs, and a RAM is used as a work area of the CPU 201. The program stored in the memory 202 is loaded into the CPU 201, thereby causing the CPU 201 to execute a coded processing. In addition, the memory 202 stores an observation matrix 300 and a projective parameter set 400. An example of the observation matrix 300 will be described later with reference to FIG. 3, for example. An example of the projective parameter set 400 will be described later with reference to FIG. 4.

The network I/F 203 is connected to a network 210 via a communication line and is connected to another computer via the network 210. Then, the network I/F 203 controls the network 210 and the internal interface and controls data input and output from other computers. As the network I/F 203, for example, a modem, a local area network (LAN) adapter, or the like may be adopted.

The disk drive 204 controls data reading and writing for the disk 205 under the control of the CPU 201. The disk drive 204 is, for example, a magnetic disk drive. The disk 205 is a nonvolatile memory that stores data written under the control of the disk drive 204. The disk 205 is, for example, a magnetic disk, an optical disk, or the like.

The recording medium I/F 206 is connected to an external recording medium 207, controls the external recording media 207 and an internal interface, and controls data input and output for the external recording media 207. The recording medium I/F 206 is, for example, a Universal Serial Bus (USB) port. The recording medium 207 is, for example, a USB memory. The recording media 207 may store the information processing program according to the embodiment.

In addition to the above-described components, the information processing device 100 may have, for example, a solid-state drive (SSD), a semiconductor memory, a keyboard, a mouse, a display, and the like. In addition, the information processing device 100 may have an SSD and a semiconductor memory in place of the disk drive 204 and the disk 205.

In addition, the information processing device 100 does not have to have the disk drive 204, the disk 205, and the recording medium I/F 206. In addition, the information processing device 100 may have a graphics processing unit (GPU). The GPU may execute a predetermined process instead of the CPU 201.

(Example of Observation Matrix 300)

Next, an example of the observation matrix 300 stored in a storage area such as the memory 202 and the disk 205 illustrated in FIG. 2 will be described with reference to FIG. 3.

Figure 3:
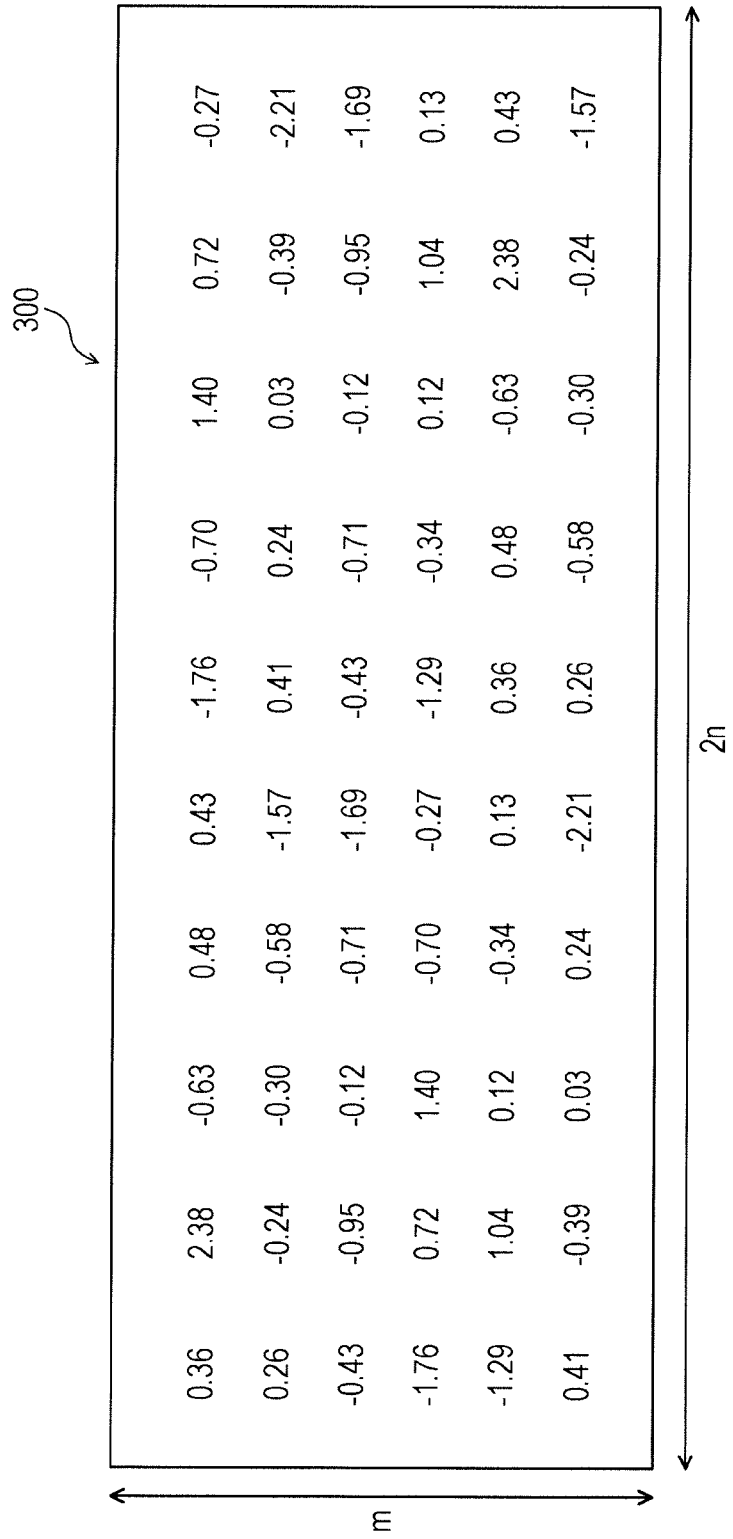
FIG. 3 is an explanatory diagram illustrating an example of an observation matrix.

FIG. 3 is an explanatory diagram illustrating an example of the observation matrix 300. The observation matrix 300 is a matrix used for 1-bit compressive sensing. The observation matrix 300 is a matrix used for a vector product operation with a projective vector obtained by projective transformation of a sparse vector to be compressed. The observation matrix 300 is a matrix of m rows by 2n columns. m is a real number greater than k. k is the number of non-zero components of the projective vector. n is the number of components of the sparse vector. 2n is twice the number of components of the sparse vector and is the number of components of the projective vector. The components of observation matrix 300 are sampled from normal distribution.

The information processing device 100 fixes the matrix used as the observation matrix 300 if the number of components of the sparse vector to be compressed is fixed. On the other hand, the information processing device 100 may not fix the matrix used as the observation matrix 300 if the number of components of the sparse vector to be compressed is uncertain. In the case of not fixing the matrix used as the observation matrix 300, the information processing device 100 adds information indicating at least the number of columns 2n of the observation matrix 300 to the compressed bit string.

For example, the information processing device 100 prepares a matrix of a rows by b columns and extracts a matrix of m rows by 2n columns as the observation matrix 300 from the matrix of a rows by b columns corresponding to the number of components of the sparse vector to be compressed. a is a number greater than the number that m may take. b is a number greater than the number that 2n may take.

(Example of Projective Parameter Set 400)

Next, an example of the projective parameter set 400 stored in the storage area such as the memory 202 or the disk 205 illustrated in FIG. 2 will be described with reference to FIG. 4.

Figure 4:
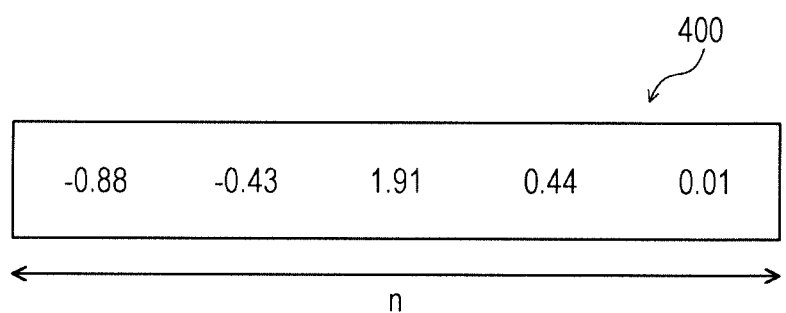
FIG. 4 is an explanatory diagram illustrating an example of a projective parameter set.

FIG. 4 is an explanatory diagram illustrating an example of the projective parameter set 400. The projective parameter set 400 is a plurality of projective parameters. The plurality of projective parameters are n parameters used for projective transformation of sparse vectors. Respective parameters are parameters used for projective transformation of respective components of the sparse vector. An i-th projective parameter is a parameter used for projective transformation of an i-th component of the sparse vector. i is 1 to n.

The plurality of projective parameters are set by a user of the information processing device 100, for example. The plurality of projective parameters may be automatically set by the information processing device 100 based on a plurality of sparse vectors. For the i-th projective parameter, for example, the standard deviation of the i-th component of each sparse vector of the plurality of sparse vectors is set. For the i-th projective parameter, for example, an index value using a percentile of the i-th component of each sparse vector of the plurality of sparse vectors may be set.

(Functional Configuration Example of Information Processing Device 100)

Next, a functional configuration example of the information processing device 100 will be described with reference to FIG. 5.

Figure 5:
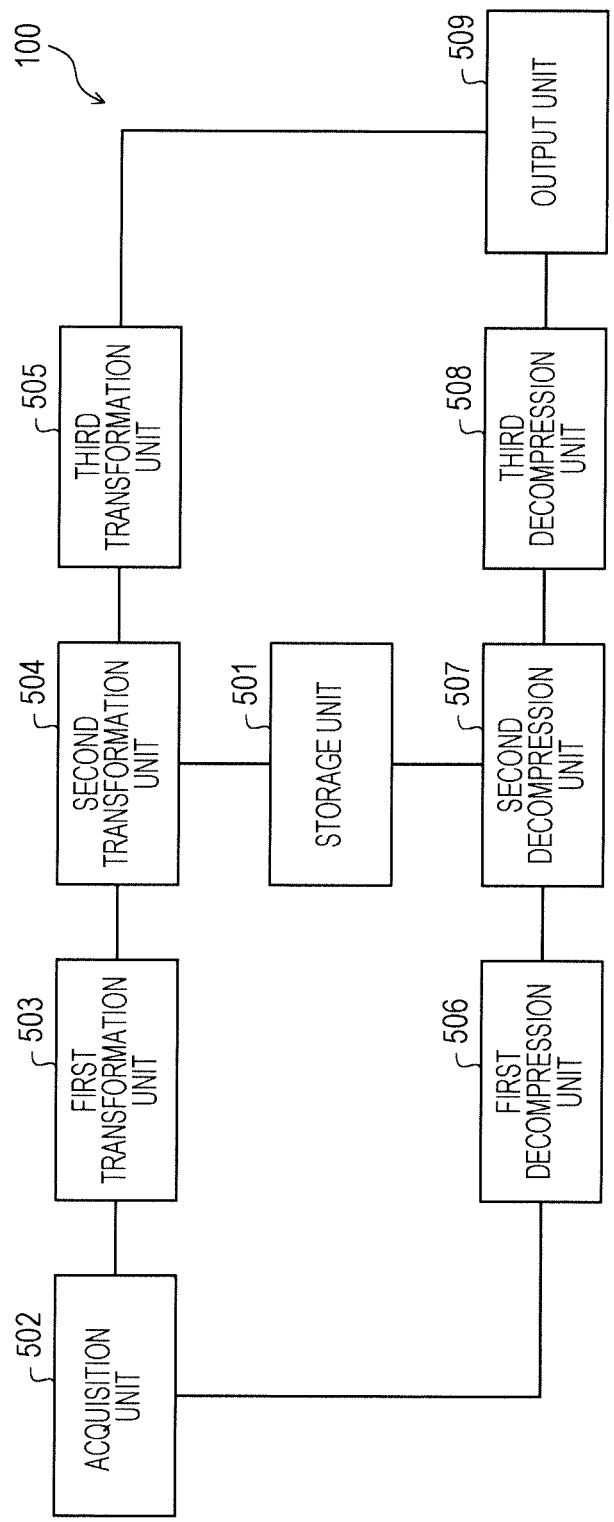
FIG. 5 is a block diagram illustrating a functional configuration example of the information processing device.

FIG. 5 is a block diagram illustrating a functional configuration example of the information processing device 100. The information processing device 100 includes a storage unit 501, an acquisition unit 502, a first transformation unit 503, a second transformation unit 504, a third transformation unit 505, a first decompression unit 506, a second decompression unit 507, a third decompression unit 508, and an output unit 509.

Specifically, the storage unit 501 realizes the function thereof by the storage area such as the memory 202 and the disk 205 illustrated in FIG. 2, for example. The acquisition unit 502 to the output unit 509 are functions as a control unit. Specifically, for example, the acquisition unit 502 to the output unit 509 realize the functions thereof by causing the CPU 201 to execute a program stored in the storage area such as the memory 202 and the disk 205 illustrated in FIG. 2, or by the network I/F 203. The processing result of each functional unit is stored in the storage area such as the memory 202 and the disk 205 illustrated in FIG. 2, for example.

The storage unit 501 stores the observation matrix 300 and the plurality of projective parameters. The observation matrix 300 is a matrix of m rows by 2n columns used for 1-bit compressive sensing. The plurality of projective parameters are n parameters used for projective transformation of sparse vectors. In this way, the storage unit 501 may store information used for 1-bit compressive sensing of projective vectors and information used for projective transformation of sparse vectors.

The acquisition unit 502 acquires an input signal to be compressed. The input signal is image data, sound data, sensor data, and the like measured by a camera, a microphone, a sensor, or the like. In this way, the acquisition unit 502 may acquire an input signal to be compressed and output the signal to the first transformation unit 503 and transform the input signal to be compressed into the first numeric string 101 to be compressed.

The first transformation unit 503 transforms the input signal acquired by the acquisition unit 502 into the first numeric string 101 corresponding to the input signal. The first numeric string 101 is a numeric string including zero components. The first numeric string 101 is preferably a sparse numeric string. The components of the first numeric string 101 are numerical values. The components of the first numeric string 101 are, for example, a single precision floating point number or fixed point number, or double precision floating point number or fixed point number.

The first transformation unit 503 transforms the input signal into the sparse first numeric string 101 by the invertible transformation of the input signal so as to include more zero components than the input signal, for example. Specifically, the first transformation unit 503 generates a sparse vector as the first numeric string 101 by performing a discrete cosine transform, the Fourier transform, wavelet basis expansion, and the like on the input signal. In this way, the first transformation unit 503 may transform the input signal to be compressed into the first numeric string 101 to be compressed having more zero components than the input signal to be compressed, thereby improving the compression efficiency.

The second transformation unit 504 performs projective transformation of the first numeric string 101 transformed by the first transformation unit 503 into the second numeric string 102 containing more components than the first numeric string 101 and having a sum of squares of the components as the predetermined value by using the plurality of projective parameters. The components of the second numeric string 102 are numerical values. The predetermined value is, for example, 1. The predetermined value may not be 1. The plurality of projective parameters include projective parameters corresponding to respective components of the first numeric string 101.

The second transformation unit 504 transforms respective components of the first numeric string 101 into a pair of components representing a vector of a predetermined size, by using, for example, projective parameters corresponding to the respective components of the first numeric string 101. Specifically, the second transformation unit 504 transforms respective components of the sparse vector into a pair of components representing a two-dimensional vector of size $1/\sqrt{n}$, by using the projective parameters corresponding to the components. In this way, the second transformation unit 504 may generate the second numeric string 102 that may be obtained by inverse projective transformation into the first numeric string 101 and decompressed even by performing 1-bit compressive sensing.

The second transformation unit 504 may transform, for example, zero components among a plurality of components of the first numeric string 101 into a pair of zero components. Then, for example, the second transformation unit 504 transforms non-zero components among a plurality of components of the first numeric string 101 into a pair of components representing a vector of the predetermined size by using the projective parameters corresponding to the positions of the non-zero components. Specifically, the second transformation unit 504 transforms zero components among a plurality of components of the sparse vector into a pair of zero components. Then, specifically, the second transformation unit 504 transforms non-zero components of the sparse vector into a pair of components representing a two-dimensional vector of size $1/\sqrt{k}$, by using the projective parameters corresponding to the non-zero components. In this way, the second transformation unit 504 may generate the second numeric string 102 that may be obtained by inverse projective transformation into the first numeric string 101 and decompressed even by performing 1-bit compressive sensing.

The second transformation unit 504 sets projective parameters. For example, in a numeric string corresponding to each input signal of a plurality of input signals, the second transformation unit 504 calculates the standard deviation for a component located at the same position as one of the components of the first numeric string 101 corresponding to an input signal to be compressed. Here, the plurality of input signals may include an input signal to be compressed. Then, the second transformation unit 504 sets the calculated standard deviation to a projective parameter corresponding to the one of the components.

Specifically, the second transformation unit 504 calculates the standard deviation of the i-th component of each sparse vector of a plurality of sparse vectors and sets the calculated standard deviation to the i-th projective parameter. In this way, the second transformation unit 504 may set relatively preferable projective parameters for improving the accuracy of specifying respective components of the sparse vector in the inverse projective transformation.

For example, in a numeric string corresponding to each input signal of a plurality of input signals, the second transformation unit 504 calculates an index value using a percentile for a component located at the same position as one of the components of the first numeric string 101. Then, the second transformation unit 504 sets the calculated index value to a projective parameter corresponding to the one of the components.

Specifically, the second transformation unit 504 calculates an index value using the percentile of the i-th component of each sparse vector of the plurality of sparse vectors and sets the calculated index value to the i-th projective parameter. In this way, the second transformation unit 504 may set relatively preferable projective parameters for improving the accuracy of specifying respective components of the sparse vector in the inverse projective transformation.

The third transformation unit 505 generates the bit string 103 in which bits indicating positive and negative signs of the respective components of the operation result obtained by a vector product operation of the second numeric string 102 obtained by projective transformation by the second transformation unit 504 and the observation matrix 300 are arranged. The third transformation unit 505 performs 1-bit compressive sensing on the projective vector to generate the bit string 103. In this way, the third transformation unit 505 may generate the bit string 103 in which sparse vectors are compressed in a state that the sizes of respective components of the sparse vector corresponding to the input signal may be specified.

The acquisition unit 502 may acquire the bit string 103 to be decompressed. The bit string 103 to be decompressed is, for example, the bit string 103 generated by the information processing device 100. The bit string 103 to be decompressed may be, for example, the bit string 103 generated by another computer. In this way, the acquisition unit 502 may acquire the bit string 103 to be decompressed and output the bit string to the first decompression unit 506 to decompress the projective vector from the bit string 103 to be decompressed.

The first decompression unit 506 decompresses the second numeric string 102 from the bit string 103 acquired by the acquisition unit 502. The first decompression unit 506 decompresses the projective vector from the bit string 103 by using the observation matrix 300 based on a property that a sum of squares of the components of the projective vector becomes 1. In this way, the first decompression unit 506 may specify the sizes of respective components of the projective vector based on the bit string 103.

The second decompression unit 507 performs inverse projective transformation of the second numeric string 102 decompressed by the first decompression unit 506 into the first numeric string 101 by using a plurality of projective parameters. The second decompression unit 507 performs inverse projective transformation of a projective vector into a sparse vector by using the plurality of projective parameters. In this way, the second decompression unit 507 may specify the sizes of respective components of the sparse vector based on the projective vector.

The third decompression unit 508 generates an input signal corresponding to the first numeric string 101 obtained by inverse projective transformation by the second decompression unit 507. In this way, the third decompression unit 508 may decompress back to an n-dimensional sparse vector before compression from the bit string 103 obtained by 1-bit compressive sensing and generate an input signal from the n-dimensional sparse vector.

The output unit 509 outputs the bit string 103 generated by the third transformation unit 505. The output format of the bit string 103 is, for example, storage in a storage area such as the memory 202 and the disk 205. The output format may be, for example, transmission to an external device by the network I/F 203. The output format may be, for example, display on a display or print output to a printer.

The output unit 509 outputs the input signal generated by the third decompression unit 508. The output format is, for example, storage in a storage area such as the memory 202 and the disk 205. The output format may be, for example, transmission to an external device by the network I/F 203. The output format may be, for example, display on a display or print output to a printer.

(Example of Operation of Information Processing Device 100 in Example 1)

Next, an example of the operation of the information processing device 100 in an example 1 will be described with reference to FIG. 6.

Figure 6:
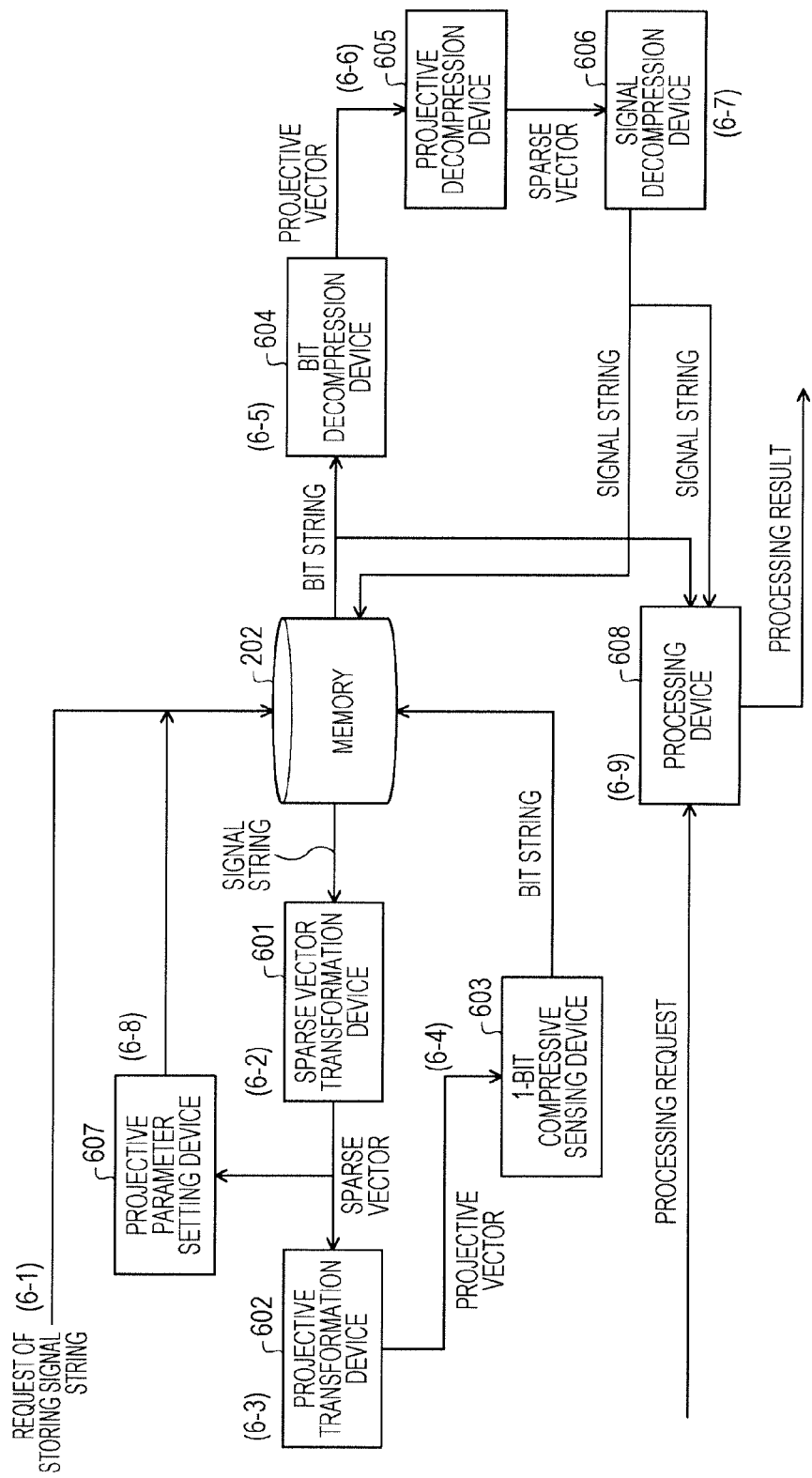
FIG. 6 is an explanatory diagram illustrating an example of an operation of the information processing device in an example 1.

FIG. 6 is an explanatory diagram illustrating an example of an operation of the information processing device 100 in the example 1. The information processing device 100 includes a sparse vector transformation device 601, a projective transformation device 602, a 1-bit compressive sensing device 603, a bit decompression device 604, a projective decompression device 605, a signal decompression device 606, a projective parameter setting device 607, and a processing device 608.

(6-1) In the example of FIG. 6, the information processing device 100 accepts a request of storing a signal string to be compressed. The information processing device 100 stores the signal string to be compressed in the memory 202 in response to the request of storing the signal string to be compressed.

(6-2) The sparse vector transformation device 601 acquires the signal string to be compressed from the memory 202. The sparse vector transformation device 601 transforms the acquired signal string into a sparse vector by performing a discrete cosine transform on the acquired signal string and replacing a component whose square is less than 1% of the sum of squares of the components with 0. The sparse vector transformation device 601 outputs the transformed sparse vector to the projective transformation device 602 and the projective parameter setting device 607.

(6-3) The projective transformation device 602 acquires a sparse vector. The projective transformation device 602 performs projective transformation of the acquired sparse vector into a projective vector. The projective transformation device 602 outputs the projective vector obtained by projective transformation to the 1-bit compressive sensing device 603.

The projective transformation device 602 generates respective components of the projective vector, for example, by substituting the respective components of the sparse vector to a projection function $f^{-1}$. Here, the projective transformation device 602 performs projective transformation from the sparse vector into the projective vector so that the vector after the projection is a sparse vector.

The projection function $f^{-1}$ is a mapping from n sets to 2n sets as illustrated in the following expression (1). In the following description, R in bold indicates a set. A superscript of the bold R indicates the number of components of the set.

$$f^{-1}: \mathbb{R}^n \to \mathbb{R}^{2n} \tag{1}$$

Specifically, the projection function $f^{-1}$ is defined by the following equation (2). In the following description, "$x_1$, $x_2$, ..., $x_n$" indicate respective components of the sparse vector. In addition, "$d_1$, $d_2$, ..., $d_n$" indicate projective parameters.

$$f^{-1}(x_1, x_2, \ldots, x_n) = \left( \frac{2d_1 x_1}{\sqrt{n}(d_1^2 + x_1^2)}, \frac{-d_1^2 + x_1^2}{\sqrt{n}(d_1^2 + x_1^2)}, \frac{2d_2 x_2}{\sqrt{n}(d_2^2 + x_2^2)}, \frac{-d_2^2 + x_2^2}{\sqrt{n}(d_2^2 + x_2^2)} \cdots, \frac{2d_n x_n}{\sqrt{n}(d_n^2 + x_n^2)}, \frac{-d_n^2 + x_n^2}{\sqrt{n}(d_n^2 + x_n^2)} \right) \tag{2}$$

The value range of the projection function $f^{-1}$ is a torus in a 2n-dimensional space as illustrated in the following expression (3). The torus is on the unit sphere in the 2n dimensional space. In the following description, "$T^n$" indicates a torus in the 2n-dimensional space. In addition, "$S^{2n-1}$" indicates a unit spherical surface in the 2n-dimensional space.

$$f^{-1}: \mathbb{R}^n \to T^n \subset S^{2n-1} \subset \mathbb{R}^{2n} \tag{3}$$

As a result, respective components of the projective vector are defined by the following equation (4) using respective components of the sparse vector. In the following description, "X" attached with "→" at the top indicates a projective vector. In addition, "$X_1$, $X_2$, ..., $X_{2n}$" indicate respective components of a projective vector.

$$\vec{X} = (X_1, X_2, \ldots, X_{2n}) = f^{-1}(x_1, x_2, \ldots, x_n) \tag{4}$$

Here, the following equation (5) is established for the projective vector, and the sum of squares of the respective components of the projective vector is 1.

$$X_1^2 + X_1^2 = \ldots + X_{2n}^2 = 1 \tag{5}$$

Since the projective vector is a sparse vector and the above equation (5) is established for the projective vector, even in a case where the projective vector is compressed by 1-bit compressive sensing, respective components of the projective vector may be specified at the time of decompression processing.

Furthermore, by substituting respective components of the projective vector into an inverse function f of the projection function $f^{-1}$, respective components of the sparse vector may be decompressed. Specifically, the inverse function f of the projection function $f^{-1}$ is defined by the following equation (6).

$$f(X_1, X_2, \ldots, X_{2n}, n) = \left( \frac{d_1 X_1}{\frac{1}{\sqrt{n}} - X_2}, \frac{d_2 X_3}{\frac{1}{\sqrt{n}} - X_4}, \ldots \frac{d_n X_{2n-1}}{\frac{1}{\sqrt{n}} - X_{2n}} \right) \tag{6}$$

In this way, the projective transformation device 602 may generate a projective vector in which the sizes of respective components may be specified even with 1-bit compressive sensing and may be performed inverse projective transformation into a sparse vector. As a result, the projective transformation device 602 may potentially include information indicating the sizes of respective components of the sparse vector in the compressed bit string. Moving on to the description of FIG. 7, an example of projective transformation and inverse projective transformation will be described.

Figure 7:
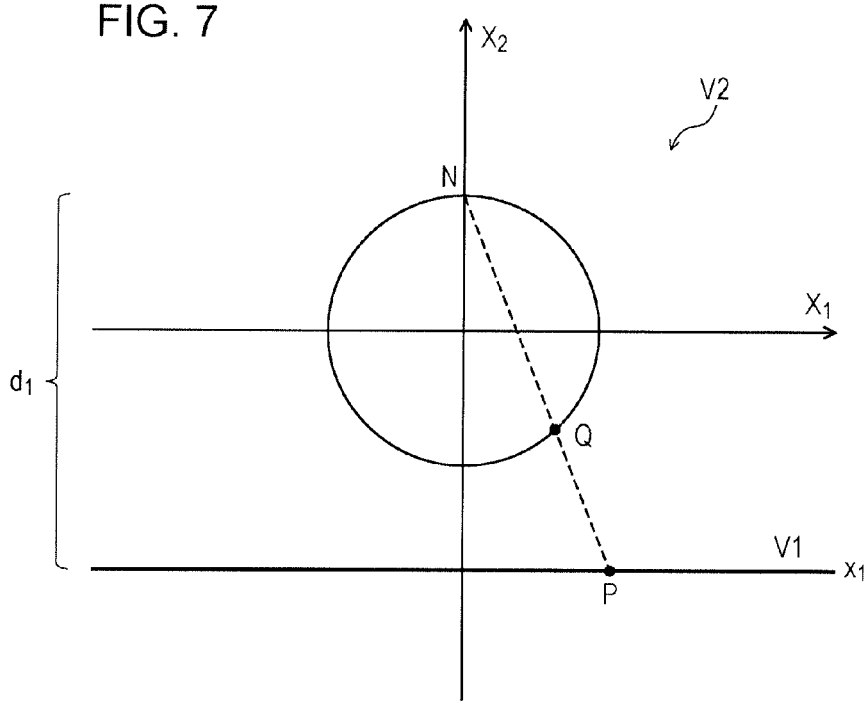
FIG. 7 is an explanatory diagram illustrating an example of projective transformation and inverse projective transformation.

FIG. 7 is an explanatory diagram illustrating an example of projective transformation and inverse projective transformation. In the example of FIG. 7, for the sake of simplicity of description, the projective transformation and inverse projective transformation between the component $x_1$ of the sparse vector in a one-dimensional subspace V1 and the components $X_1$ and $X_2$ of the projective vector in a two-dimensional subspace V2 will be described.

In FIG. 7, the coordinate value of a point P on the $x_1$ axis to be the one-dimensional subspace V1 indicates the component $x_1$ of the sparse vector. On the other hand, the coordinate values of a point Q in the coordinate system of an $X_1$ axis and an $X_2$ axis to be the two-dimensional subspace V2 indicate the components $X_1$ and $X_2$ of the projective vector. The point Q is located on a circle having a radius of $1/\sqrt{n}$ in the coordinate system of the $X_1$ axis and the $X_2$ axis to be the two-dimensional subspace space V2.

The $x_1$ axis which becomes one-dimensional subspace V1 is defined as a straight line whose distance from the point N located on a circle having a radius of $1/\sqrt{n}$ in the coordinate system of the $X_1$ axis and the $X_2$ axis to be the two-dimensional subspace V2 is the value of the projective parameter $d_1$. An intersection point of a straight line drawn passing from the point N to the point Q and the $x_1$ axis to be the one-dimensional subspace V1 is a point P.

In FIG. 7, the projection function $f^{-1}$ is a function indicating a mapping from the one-dimensional subspace V1 to the two-dimensional subspace V2. The projection function f performs projective transformation of the coordinate value $x_1$ of the point P on the $x_1$ axis to be one-dimensional subspace V1 into a coordinate value $(X_1, X_2)$ of the point Q in the coordinate system of the $X_1$ axis and the $X_2$ axis to be the two-dimensional subspace V2.

In FIG. 7, the inverse function f of the projection function $f^{-1}$ is a function indicating a mapping from the two-dimensional subspace V2 to the one-dimensional subspace V1. The inverse function f of the projection function $f^{-1}$ performs inverse projective transformation of the coordinate value $(X_1, X_2)$ of the point Q in the coordinate system of the $X_1$ axis and the $X_2$ axis to be the two-dimensional subspace V2 into the coordinate value $x_1$ of the point P on the $x_1$ axis to be one-dimensional subspace V1.

Here, the relationship between the component $x_1$ of the sparse vector and the components $X_1$ and $X_2$ of the projective vector has been described, but the relationship between respective components $x_1, x_2, \ldots, x_n$ of the sparse vector and respective components $X_1, X_2, \ldots, X_n$ of the projective vector are also the same.

(6-4) Returning to the explanation of FIG. 6, the 1-bit compressive sensing device 603 performs 1-bit compressive sensing on the projective vector, transforms the projective vector into a bit string, and stores the bit string in the memory 202. In addition, the 1-bit compressive sensing device 603 may further compress the compressed bit string using run length encoding or the like.

The 1-bit compressive sensing device 603 generates a bit string, for example, by substituting the observation matrix 300 and the sparse vector into a function thr. Specifically, the 1-bit compressive sensing device 603 substitutes the observation matrix 300 and the sparse vector into the following equation (7). In the following description, "A" indicates the observation matrix 300. In addition, "y" attached with "→" at the top indicates the bit string after compression. "x" attached with "→" at the top indicates a sparse vector.

$$\vec{y} = thr(A * f^{-1}(\vec{x})) \quad (7)$$

Specifically, the function thr is defined by the following equation (8). In other words, the function thr is a function that outputs a bit indicating whether the argument a is positive or negative.

$$thr(a) = \begin{cases} 1 & \text{if } a > 0 \\ 0 & \text{otherwise} \end{cases} \quad (8)$$

As described above, the information processing device 100 may perform projective transformation of a sparse vector corresponding to an input signal into a projective vector that may be performed inverse projective transformation and compress the projective vector into a bit string which may specify the sizes of respective components of the projective vector. As a result, the information processing device 100 may generate a bit string by compressing the sparse vector in a state that the sizes of respective components of the sparse vector corresponding to the input signal may be specified.

(6-5) The bit decompression device 604 acquires a bit string to be decompressed from the memory 202. The bit decompression device 604 decompresses the projective vector from the acquired bit string using the observation matrix 300. The bit decompression device 604 outputs the decompressed projective vector to the projective decompression device 605.

The bit decompression device 604 decompresses the projective vector from the bit string using the observation matrix 300 based on a decompression algorithm such as 1-bit fixed point continuation (FPC), for example. As described above, the same observation matrix 300 is used for the compression processing and the decompression processing.

For 1-bit FPC, for example, the above-described Non-Patent Literature "P. Boufounos and R. G. Baraniuk, "1-bit compressive sensing," Annu. Conf Information Sciences and Systems (CISS), 42nd, 2008" may be referred to.

(6-6) The projective decompression device 605 decompresses a sparse vector from the projective vector. The projective decompression device 605 outputs the decompressed sparse vector to the signal decompression device 606. The projective decompression device 605 decompresses the sparse vector from the projective vector by using, for example, the inverse function f defined in the above equation (6).

Specifically, the projective decompression device 605 substitutes the projective vector decompressed from the observation matrix 300 and the bit string into the following equation (9) including the inverse function f. In the following description, "Δ" indicates a decompression algorithm of 1-bit FPC.

$$\vec{x} = f(\Delta(A, \vec{y})) \quad (9)$$

(6-7) The signal decompression device 606 decompresses a signal string from the sparse vector. The signal decompression device 606 stores the decompressed signal string in the memory 202. In addition, the signal decompression device 606 may output the decompressed signal string to the processing device 608. As described above, the information processing device 100 may decompress back to the sparse vector before compression from the bit string and generate an input signal from the decompressed sparse vector.

(6-8) The projective parameter setting device 607 acquires p sparse vectors from the sparse vector transformation device 601 and sets projective parameters based on the p sparse vectors. For example, the projective parameter setting device 607 substitutes the i-th component $x_i$ of the p sparse vectors into the following equation (10) to calculate a standard deviation $\sigma_i$ for the i-th component $x_i$.

$$\sigma_i = \sqrt{\frac{1}{p}\sum_{k=1}^{p} x_i^{(k)2}} \quad \left( = \sqrt{\frac{1}{p}\sum_{k=1}^{p}(x_i^{(k)} - \mu_i)^2} \right) \quad (10)$$

The projective parameter setting device 607 overwrites the standard deviation $\sigma_i$ for the calculated i-th component $x_i$ as the value of an i-th projective parameter $d_i$ stored in the memory 202. In this way, the information processing device 100 may set relatively preferable projective parameters for improving the accuracy of specifying respective components of the sparse vector in the inverse projective transformation.

For example, since the i-th component $x_i$ of each sparse vector of a plurality of sparse vectors may be various values, the i-th projective parameter $d_i$ is preferably set so that it is easy to distinguish the difference between the i-th components $x_i$ of respective sparse vectors at the time of inverse projective transformation.

On the other hand, if the i-th projective parameter $d_i$ is set to an undesirable value, there is a tendency that the difference between the pairs of a 2i−1th component $X_{2i-1}$ and a 2i-th component $X_{2i}$ of respective projective vectors after the projective transformation becomes small. Then, the smaller the difference between the pairs of the 2i−1th component $X_{2i-1}$ and the 2i-th component $X_{2i}$ of respective projective vectors after the projective transformation, the more difficult it is to distinguish the difference between the i-th component $x_i$ of respective sparse vectors before the projective transformation.

For example, the projective parameter $d_i$ is sufficiently small with respect to the variation of the i-th component $x_i$ in some cases. In this case, a pair of the 2i−1-th component $X_{2i-1}$ and the 2i-th component $X_{2i}$ after the projective transformation of the i-th component $x_i$ is likely to gather near a point (0, 1/√n) in the two-dimensional subspace V2. Therefore, in a case where the projective parameter $d_i$ is sufficiently small with respect to the variation of the i-th component $x_i$, it tends to be difficult to distinguish the difference of the i-th components $x_i$ of respective sparse vectors before the projective transformation.

In addition, for example, the projective parameter $d_i$ is sufficiently large with respect to the variation of the i-th component $x_i$ in some cases. In this case, a pair of the 2i−1-th component $X_{2i-1}$ and the 2i-th component $X_{2i}$ after the projective transformation of the i-th component $x_i$ is likely to gather near a point (0, −1/√n) in the two-dimensional subspace V2. Therefore, in a case where the projective parameter $d_i$ is sufficiently large with respect to the variation of the i-th component $x_i$, it tends to be difficult to distinguish the difference of the i-th components $x_i$ of respective sparse vector before the projective transformation.

On the other hand, the projective parameter setting device 607 may use the standard deviation $\sigma_i$ for the i-th component $x_i$ as the value of the i-th projective parameter $d_i$. Therefore, the projective parameter setting device 607 suppresses the value of the i-th projective parameter $d_i$ from becoming a value that is too small with respect to the variation of the i-th component $x_i$ and becoming a value that is too large with respect to the variation of the i-th component $x_i$. As a result, the projective parameter setting device 607 may set the i-th projective parameter $d_i$ so that it is easy to distinguish the difference of the i-th component $x_i$ of each sparse vector at the time of the inverse projective transformation.

In addition, the projective parameter setting device 607 may calculate $d_i=(x_i^{(90)}-x_i^{(10)})/2$ as the value of the i-th projective parameter $d_i$. Here, $x_i^{(90)}$ is a 90th percentile of the i-th component of the p sparse vectors. $X_i^{(10)}$ is a tenth percentile of the i-th component of the p sparse vectors. The percentile is also referred to as a centile.

In this way, the projective parameter setting device 607 suppresses the value of the i-th projective parameter $d_i$ from becoming a value that is too small with respect to the variation of the i-th component $x_i$ and becoming a value that is too large with respect to the variation of the i-th component $x_i$. As a result, the projective parameter setting device 607 may set the i-th projective parameter $d_i$ so that it is easy to distinguish the difference of the i-th components $x_i$ of respective sparse vectors at the time of the inverse projective transformation. In addition, since the percentile is used, even in a case where an outlier is included in the i-th component $x_i$, the projective parameter setting device 607 easily set the relatively preferable projective parameter $d_i$.

Here, the case where the projective parameter is an index value based on the standard deviation or the percentile has been described, but the embodiment is not limited thereto. For example, the projective parameter setting device 607 may set an average value $(\sigma_i+\sigma_j)/2$ of the standard deviations of the i-th and j-th components to projective parameters $d_i$ and $d_j$. In addition, the projective parameter setting device 607 may set the arithmetic mean or the root mean square of the standard deviation of an n-th component from a first component to projective parameters $d_1$ to $d_n$.

Here, the case where the projective parameter setting device 607 sets projective parameters based on the p sparse vectors obtained from the sparse vector transformation device 601 has been described, but the embodiment is not limited thereto. For example, the projective parameter setting device 607 may acquire p sparse vectors obtained by inverse projective transformation by the projective decompression device 605 and set a projective parameter based on the obtained p sparse vectors.

In addition, the projective parameter setting device 607 may update the projective parameter at every predetermined timing. For example, the projective parameter setting device 607 may update the projective parameter based on the latest p sparse vectors each time a sparse vector is acquired from the sparse vector transformation device 601. In addition, for example, the projective parameter setting device 607 may update the projective parameter based on the latest p sparse vectors each time a predetermined number of sparse vectors are acquired from the sparse vector transformation device 601.

In addition, for example, the projective parameter setting device 607 may update the projective parameter based on the latest p sparse vectors every day at a predetermined time. In addition, for example, the projective parameter setting device 607 may update the projective parameter based on the latest p sparse vectors each time the information processing device 100 is activated.

(6-9) The processing device 608 accepts a processing request and executes the requested processing based on the compressed bit string stored in the memory 202 or the signal string acquired from the signal decompression device 606. The processing request is, for example, a search request, a collation request, an analysis request, or the like. The processing device 608, for example, performs analysis using the acquired bit string as an input of machine learning in response to the analysis request and outputs the analysis result.

In addition, in response to the search request, the processing device 608 decompresses the sparse vector from the acquired bit string and searches for a similar sparse vector. In addition, in response to the search request, based on the Hamming distance between the acquired bit strings, the processing device 608 may calculate the similarity between the bit strings that may approximate the similarity between the sparse vectors and search similar sparse vectors. In addition, the processing device 608 may cluster the compressed bit string stored in the memory 202. In addition, the processing device 608 may detect a bit string or the like that does not satisfy the predetermined condition among the compressed bit strings stored in the memory 202 as abnormal data.

In the above description, the case where one information processing device 100 may execute both the compression processing of compressing a signal string into a bit string and the decompression processing of decompressing the signal string from the bit string has been described, but the embodiment is not limited thereto. For example, a compression-side device that operates as the information processing device 100 capable of executing compression processing and a decompression-side device that operates as the information processing device 100 capable of executing decompression processing may exist separately.

In this case, the compression-side device and the decompression-side device have the same observation matrix 300 and the same projective parameter set 400. For example, when first communicating with the decompression-side device, the compression-side device transmits the observation matrix 300 and the projective parameter set 400 used by the compression-side device for compression processing to the decompression-side device.

In addition, the same observation matrix 300 and the same projective parameter set 400 may be preset in the compression-side device and the decompression-side device. In addition, in the case of updating the projective parameter based on a plurality of sparse vectors, each time the compression-side device updates the projective parameter, the compression-side device may transmit the updated projective parameter set 400 including a updated projective parameter to the decompression-side device.

In addition, even in a case where projective parameters are updated based on a plurality of sparse vectors, the compression-side device does not have to transmit the updated projective parameter set 400 including the updated projective parameters to the decompression-side device in some cases. For example, the decompression-side device may update the projective parameters based on the plurality of sparse vectors obtained by the decompression process similarly to the compression-side device.

(Example of Operation of Information Processing Device 100 in Example 2)

Next, an example of the operation of the information processing device 100 in an example 2 will be described.

The example 2 is an example obtained by modifying the projection function $f^{-1}$ and the inverse function f of the example 1. Since the operation of the information processing device 100 in the example 2 is the same except that the projection function $f^{-1}$ and the inverse function f are different, the description other than the projection function $f^{-1}$ and the inverse function f will be omitted.

The projection function $f^{-1}$ in example 2 is defined by the following equation (11). In the following description, "k" is the number of non-zero components of the sparse vector. The information processing device 100 performs projective transformation of the respective components of the sparse vector into respective components of the projective vector by using the following equation (11) in the range of i=1 to n.

$$f^{-1}(x_i) = \begin{cases} 0, 0 & \text{if } x_i = 0 \\ \frac{2d_i x_i}{\sqrt{k}(d_i^2 + x_i^2)}, \frac{-d_i^2 + x_i^2}{\sqrt{k}(d_i^2 + x_i^2)} & \text{otherwise} \end{cases} \quad (11)$$

In the above equation (11), in a case where the i-th component $x_i$ of the sparse vector is 0, the pair of the component $X_{2i-1}$ and the component $X_{2i}$ of the projective vector is (0, 0). In this way, the information processing device 100 may easily generate a projective vector with more zero components, fewer non-zero components, and strong sparsity.

Here, the number of rows m of the observation matrix 300 may be a real number larger than the number k of non-zero components. In other words, the smaller the number k of non-zero components is, the smaller the number of rows m of the observation matrix 300 may be. For this reason, the information processing device 100 may reduce the number of rows m of the observation matrix 300 used for 1-bit compressive sensing by further reducing the non-zero components of the projective vector. In this way, the information processing device 100 may suppress an increase in the amount of the operation used for a vector product operation between the projective vector and the observation matrix 300 and suppress an increase in time taken for a vector product operation between the projective vector and the observation matrix 300.

Further, the number of rows m of the observation matrix 300 is a length of the compressed bit string. For this reason, the information processing device 100 may further reduce the number of rows m of the observation matrix 300 by further reducing the non-zero components of the projective vector, and it is possible to further reduce the length of the bit string after the compression. In this way, the information processing device 100 may improve the compression efficiency.

In addition, in the above equation (11), in a case where the i-th component $x_i$ of the sparse vector is a non-zero component, the pair of the component $X_{2i-1}$ and the component $X_{2i}$ of the projective vector is a pair of components indicating a two-dimensional vector of a length $1/\sqrt{k}$. In this way, even in a case where the projection function $f^{-1}$ in the example 2 is used, the information processing device 100 may establish the above equation (5) for the projective vector.

Since the projective vector is a sparse vector and the above equation (5) is established for the projective vector, even in a case where the projective vector is compressed by 1-bit compressive sensing, respective components of the projective vector may be specified at the time of decompression processing. In this way, the information processing device 100 may generate a projective vector that may be performed inverse projective transformation into a sparse vector and also be decompressed from a compressed bit string.

In addition, specifically, the inverse function f of the projection function $f^{-1}$ in the example 2 is defined by the following equation (12). Here, the information processing device 100 counts the number k of the non-zero components of the sparse vector based on the decompressed projective vector and uses the counted number as a (2n+1)th input of the inverse function f.

For example, referring to the above equation (11), among the pairs of two components from the head of the projective vector, a pair of zero components corresponds to zero components of the sparse vector and a pair of components that are not a pair of zero components corresponds to non-zero components of the sparse vector.

Therefore, the information processing device 100 may determine the number k of non-zero components of the sparse vector by counting the number of pairs that are not pairs of zero components among the pairs of two components from the head of the decompressed projective vector. Then, the information processing device 100 uses the determined number k of non-zero components of the sparse vector as the 2n+1st input of the inverse function f. In this way, the information processing device 100 may perform inverse projective transformation from a projective vector into a sparse vector.

$$f(X_1, X_2, \ldots, X_{2n}, k) = \left( \frac{d_1 X_1}{\frac{1}{\sqrt{k}} - X_2}, \frac{d_2 X_3}{\frac{1}{\sqrt{k}} - X_4}, \ldots \frac{d_n X_{2n-1}}{\frac{1}{\sqrt{k}} - X_{2n}} \right) \quad (12)$$

(Example of Setting Processing Procedure)

Next, an example of a setting processing procedure for setting a projective parameter will be described with reference to FIG. 8.

Figure 8:
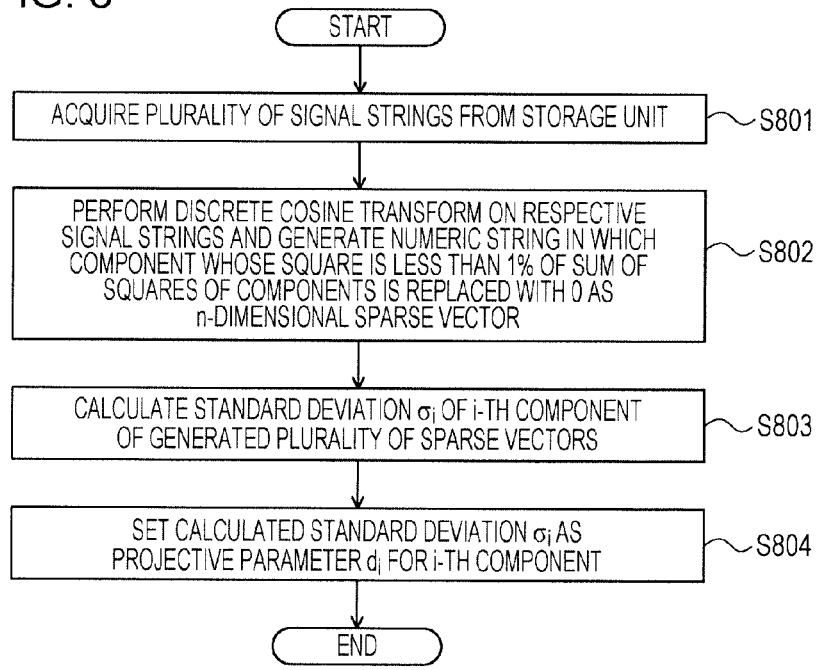
FIG. 8 is a flowchart illustrating an example of a setting processing procedure.

FIG. 8 is a flowchart illustrating an example of a setting processing procedure. In FIG. 8, the information processing device 100 acquires a plurality of signal strings from the storage unit 501 (step S801). Here, the number of components of each signal string of the acquired plurality of signal strings is n.

Next, the information processing device 100 performs a discrete cosine transform on respective signal strings, and generates a numeric string in which a component whose square is less than 1% of the sum of squares of the components is replaced with 0 as the n-dimensional sparse vector (step S802). Then, the information processing device 100 calculates the standard deviation $\sigma_i$ of the i-th component of the generated plurality of sparse vectors (step S803). Here, i is 1 to n, and the same processing is repeated from i=1 to i=n.

Next, the information processing device 100 sets the calculated standard deviation $\sigma_i$ to the projective parameter $d_i$ for the i-th component (step S804). This processing is also repeated from i=1 to i=n. Then, the information processing device 100 ends the setting processing. In this way, the information processing device 100 may set relatively preferable projective parameters for improving the accuracy of specifying respective components of the n-dimensional sparse vector in the inverse projective transformation.

(Example of Compression Processing Procedure)

Next, an example of a compression processing procedure for setting a projective parameter will be described with reference to FIG. 9.

Figure 9:
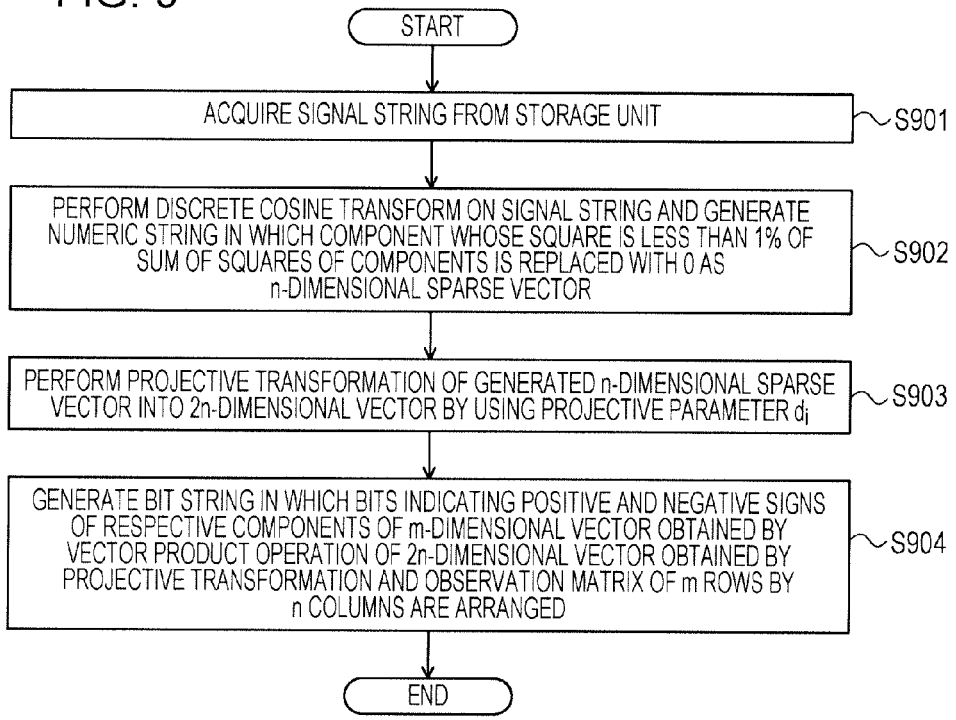
FIG. 9 is a flowchart illustrating an example of a compression processing procedure.

FIG. 9 is a flowchart illustrating an example of a compression processing procedure. In FIG. 9, the information processing device 100 acquires a signal string from the storage unit 501 (step S901). Here, the number of components of the acquired signal string is n.

Next, the information processing device 100 performs a discrete cosine transform on the signal string, and generates a numeric string in which a component whose square is less than 1% of the sum of squares of the components is replaced with 0 as the n-dimensional sparse vector (step S902). Then, the information processing device 100 performs projective transformation of the generated n-dimensional sparse vector into a 2n-dimensional vector by using the projective parameter $d_i$ (step S903).

Next, the information processing device 100 generates a bit string in which bits indicating positive and negative signs of respective components of an m-dimensional vector obtained by a vector product operation of the 2n dimensional vector obtained by projective transformation and the observation matrix 300 of m rows by n columns are arranged (step S904). Here, the number of components of the generated bit string is m. Then, the information processing device 100 ends the compression processing. In this way, the information processing device 100 may compress the n-dimensional sparse vector corresponding to the signal string in a state that the n-dimensional sparse vector may be decompressed.

In addition, steps S801 and S802 in FIG. 8 and steps S901 and S902 in FIG. 9 are the same processing. Therefore, for example, the information processing device 100 may include the processing of steps S901 and S902 of FIG. 9 in the processing of steps S801 and S802 of FIG. 8.

(Example of Decompression Processing Procedure)

Next, an example of a decompression processing procedure for setting a projective parameter will be described with reference to FIG. 10.

Figure 10:
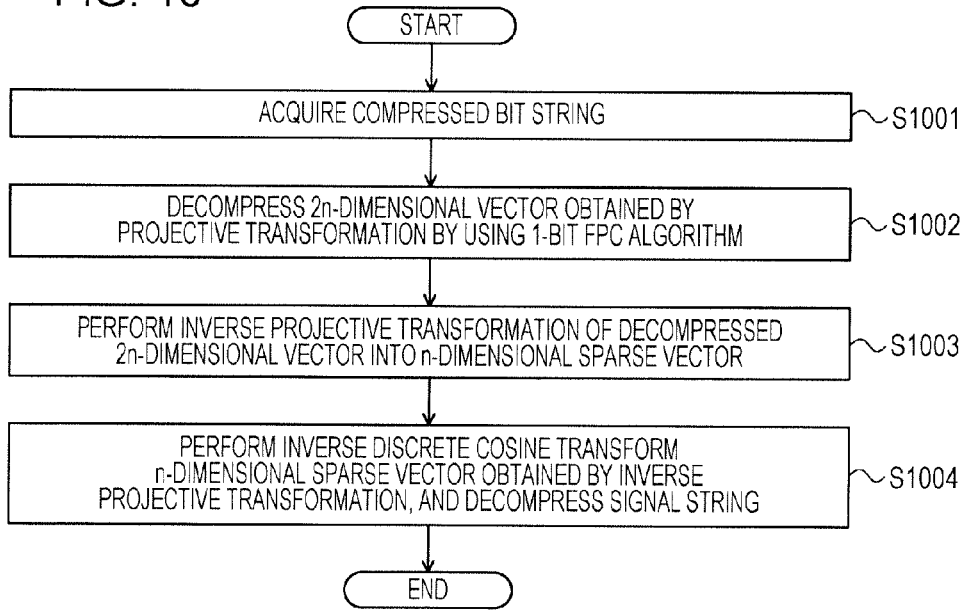
FIG. 10 is a flowchart illustrating an example of a decompression processing procedure.

FIG. 10 is a flowchart illustrating an example of a decompression processing procedure. In FIG. 10, the information processing device 100 acquires a compressed bit string (step S1001). Here, the number of components of the acquired bit string is m.

Next, the information processing device 100 decompresses the 2n-dimensional vector obtained by projective transformation by using a 1-bit FPC algorithm (step S1002). Then, the information processing device 100 performs inverse projective transformation of the decompressed 2n-dimensional vector into an n-dimensional sparse vector (step S1003).

Next, the information processing device 100 performs an inverse discrete cosine transform into the n-dimensional sparse vector obtained by inverse projective transformation and decompresses the signal string (step S1004). Then, the information processing device 100 ends the decompression processing. In this way, the information processing device 100 may decompress back to an n-dimensional sparse vector before compression from the bit string obtained by 1-bit compressive sensing and generate a signal string from the n-dimensional sparse vector.

As explained above, according to information processing device 100, it is possible to perform projective transformation of a sparse vector corresponding to an input signal into a projective vector containing more components than the sparse vector and having a sum of squares of the components as a predetermined value by using a plurality of projective parameters. In addition, according to information processing device 100, it is possible to generate a bit string in which bits indicating positive and negative signs of respective components of the vector product result of the projective vector obtained by projective transformation and the observation matrix 300 are arranged. In this way, the information processing device 100 may compress the n-dimensional sparse vector corresponding to the signal string in a state that the n-dimensional sparse vector may be decompressed.

In addition, according to information processing device 100, respective components of the sparse vector may be transformed into a pair of components representing a vector of a predetermined size by using projective parameters corresponding to the respective components of the sparse vector. In this way, the information processing device 100 may set the sum of squares of the components as a predetermined value at the time of generating a projective vector.

In addition, according to the information processing device 100, in a numeric string corresponding to each input signal of a plurality of input signals, it is possible to calculate the standard deviation for a component located at the same position as one of the components of the sparse vector. In addition, according to the information processing device 100, the calculated standard deviation may be set to a projective parameter corresponding to the one of the components. In this way, the information processing device 100 may set relatively preferable projective parameters for improving the accuracy of specifying respective components of the sparse vector in the inverse projective transformation.

In addition, according to the information processing device 100, in a numeric string corresponding to each input signal of a plurality of input signals, it is possible to calculate an index value using the percentile for a component located at the same position as one of the components of the sparse vector. In addition, according to the information processing device 100, the calculated index value may be set to a projective parameter corresponding to the one of the components. In this way, the information processing device 100 may set relatively preferable projective parameters for improving the accuracy of specifying respective components of the sparse vector in the inverse projective transformation.

In addition, according to the information processing device 100, it is possible to use a numeric string obtained by invertible transformation of the input signal so as to include more zero components than the input signal as a sparse vector. In this way, the information processing device 100 may easily satisfy the decompression condition of 1-bit compressive sensing.

In addition, according to the information processing device 100, zero components among a plurality of components of the sparse vector may be transformed into a pair of zero components. In addition, according to information processing device 100, it is possible to transform non-zero components among a plurality of components of a sparse vector into a pair of components representing a vector of a predetermined size by using projective parameters corresponding to the non-zero components. In this way, the information processing device 100 may further reduce the non-zero components of the projective vector and the length of the bit string obtained by 1-bit compressive sensing, thereby improving the compression efficiency.

In addition, according to information processing device 100, it is possible to decompress a projective vector from a bit string, perform inverse projective transformation of the decompressed projective vector into a sparse vector by using a plurality of projective parameters, and generate an input signal corresponding to the sparse vector obtained by inverse projective transformation. In this way, the information processing device 100 may decompress back to an n-dimensional sparse vector before compression from the bit string obtained by 1-bit compressive sensing and generate a signal string from the n-dimensional sparse vector.

A complete invertible transformation is not performed between an original input signal and the signal after 1-bit compressive sensing, but since almost complete invertible transformation is performed between the sparse vector obtained by subjecting an input signal to a discrete cosine transform and the like and the signal after the 1-bit compressive sensing, the disclosed invertible transformation may be applied to compression of signals such as images, sound, various sensor data, or the like, and it is expected to expand the coverage of Internet of things (IoT) and Big Data, shorten processing time, and simplify a processing device.

The information processing method described in the present embodiment may be realized by executing a prepared program on a computer such as a personal computer or a workstation. This information processing program is recorded in a computer-readable recording medium such as a hard disk, a flexible disk, a CD-ROM, an MO, a DVD, and the like and is executed by reading out from the recording media by a computer. Further, the information processing program may be distributed via a network such as the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An information processing device comprising:
    a memory, and
    a processor coupled to the memory and configured to execute a process comprising;
    performing projective transformation of a first numeric string corresponding to an input signal into a second numeric string which contains more components than the first numeric string and having a sum of squares of components as a predetermined value by using a plurality of projective parameters; and
    generating a bit string in which bits indicating positive and negative signs of respective components of a vector product result of the second numeric string obtained by the projective transformation and an observation matrix are arranged.

2. The information processing device according to claim 1,
    wherein the plurality of projective parameters include projective parameters corresponding to the respective components of the first numeric string, and
    the projective transformation is performed by transforming the respective components of the first numeric string into a pair of components representing a vector of a predetermined size by using the projective parameters corresponding to the respective components of the first numeric string.

3. The information processing device according to claim 2,
    wherein each of the projective parameters is set based on a standard deviation for components located at the same positions in a plurality of numeric strings corresponding to a plurality of input signals, as a position of each component of the first numeric string.

4. The information processing device according to claim 2,
    wherein each of the projective parameters is set based on an index value using a percentile for components located at the same positions in a plurality of numeric strings corresponding to a plurality of input signals, as a position of each component of the first numeric string.

5. The information processing device according to claim 1,
    wherein the first numeric string is a numeric string obtained by invertible transformation of the input signal so as to include more zero components than the input signal.

6. The information processing device according to claim 1,
    wherein the plurality of projective parameters include projective parameters corresponding to the respective components of the first numeric string, and
    the projective transformation is performed by transforming zero components among the plurality of components of the first numeric string into a pair of zero components and transforming non-zero components among the plurality of components of the first numeric string into a pair of components representing a vector of a predetermined size using projective parameters corresponding to the non-zero components.

7. An information processing method executed by a computer, the method comprising:
    performing projective transformation of a first numeric string corresponding to an input signal into a second numeric string which contains more components than the first numeric string and having a sum of squares of components as a predetermined value by using a plurality of projective parameters; and
    generating a bit string in which bits indicating positive and negative signs of the respective components of an operation result obtained by a vector product operation of the second numeric string obtained by the projective transformation and an observation matrix are arranged.

8. A computer-readable and non-transitory medium storing a program that causes a computer to execute a processing of:
    performing projective transformation of a first numeric string corresponding to an input signal into a second numeric string which contains more components than the first numeric string and having a sum of squares of components as a predetermined value by using a plurality of projective parameters, and
    generating a bit string in which bits indicating positive and negative signs of the respective components of a vector product operation of the second numeric string obtained by the projective transformation and an observation matrix are arranged.

9. An information processing device comprising:
    a memory, and
    a processor coupled to the memory and configured to execute a process comprising;

decompressing a second numeric string from a bit string in which bits indicating positive and negative signs of respective components of a vector product result of an observation matrix and the second numeric string containing more components than a first numeric string and having a sum of squares of components as a predetermined value, which is obtained by projective transformation of the first numeric string corresponding to an input signal using a plurality of projective parameters, are arranged, and performing inverse projective transformation of the decompressed second numeric string into the first numeric string using the plurality of projective parameters to generate the input signal corresponding to the first numeric string obtained by the inverse projective transformation.

10. An information processing method executed by a computer, the method comprising:

decompressing the second numeric string from a bit string in which bits indicating positive and negative signs of the respective components of a vector product result of an observation matrix and the second numeric string containing more components than the first numeric string and having a sum of squares of components as a predetermined value, which is obtained by projective transformation of a first numeric string corresponding to an input signal using a plurality of projective parameters, are arranged, and performing inverse projective transformation of the decompressed second numeric string into the first numeric string using the plurality of projective parameters to generate the input signal corresponding to the first numeric string obtained by the inverse projective transformation.

11. A computer-readable and non-transitory medium storing a program that causes a computer to execute a processing of:

decompressing a second numeric string from a bit string in which bits indicating positive and negative signs of the respective components of a vector product result of an observation matrix and the second numeric string containing more components than a first numeric string and having a sum of squares of components as a predetermined value, which is obtained by projective transformation of the first numeric string corresponding to an input signal using a plurality of projective parameters, are arranged, and performing inverse projective transformation of the decompressed second numeric string into the first numeric string using the plurality of projective parameters to generate the input signal corresponding to the first numeric string obtained by the inverse projective transformation.

\* \* \* \* \*